US012123841B2

(12) United States Patent
Effting

(10) Patent No.: US 12,123,841 B2
(45) Date of Patent: Oct. 22, 2024

(54) APPARATUS AND METHOD FOR PROJECTING AN ARRAY OF MULTIPLE CHARGED PARTICLE BEAMLETS ON A SAMPLE

(71) Applicant: DELMIC IP B.V., Delft (NL)

(72) Inventor: Andries Pieter Johan Effting, Delft (NL)

(73) Assignee: DELMIC IP B.V., Delft (NL)

( * ) Notice: Subject to any disclaimer, the term of this patent is extended or adjusted under 35 U.S.C. 154(b) by 0 days.

(21) Appl. No.: 17/792,810

(22) PCT Filed: Jan. 18, 2021

(86) PCT No.: PCT/EP2021/050928
§ 371 (c)(1),
(2) Date: Jul. 14, 2022

(87) PCT Pub. No.: WO2021/144468
PCT Pub. Date: Jul. 22, 2021

(65) Prior Publication Data
US 2023/0038465 A1    Feb. 9, 2023

(30) Foreign Application Priority Data

Jan. 17, 2020  (NL) .................................... 2024694

(51) Int. Cl.
*H01J 37/22*     (2006.01)
*G01N 23/2254*   (2018.01)
*H01J 37/20*     (2006.01)

(52) U.S. Cl.
CPC .......... *G01N 23/2254* (2013.01); *H01J 37/20* (2013.01); *H01J 2237/202* (2013.01); *H01J 2237/2482* (2013.01)

(58) Field of Classification Search
None
See application file for complete search history.

(56) References Cited

U.S. PATENT DOCUMENTS

| 2014/0175303 A1 | 6/2014 | Touya et al. |
| 2015/0027095 A1 | 1/2015 | Marschall et al. |

(Continued)

FOREIGN PATENT DOCUMENTS

WO    2007143736 A2    12/2007

OTHER PUBLICATIONS

Ren et al., "Transmission Electron Imaging in the Delft Multibeam Scanning Electron Microscope 1," Journal of Vacuum Science & Technology B, vol. 34, No. 6, Oct. 27, 2016, 11 pages.

(Continued)

*Primary Examiner* — Eliza W Osenbaugh-Stewart
(74) *Attorney, Agent, or Firm* — Workman Nydegger

(57) ABSTRACT

A method and apparatus for inspecting a sample is provided. The apparatus includes a sample holder for holding the sample at a sample plane, a charged particle column for generating an array of multiple charged particle beamlets and directing the array towards the sample holder, a position sensor, and a control unit. The charged particle column includes an objective lens for focusing the charged particle beamlets of the array in an array of charged particle beam spots at or near the sample plane. The objective lens includes a magnetic lens common for all charged particle beamlets. The position sensor provides a signal which is dependent on the position of the sample. The control unit controls the position of the sample holder on the basis of the signal from the position sensor, to keep the pitch and/or orientation of the spots on the sample constant.

11 Claims, 2 Drawing Sheets

(56) References Cited

U.S. PATENT DOCUMENTS

2015/0262784 A1* 9/2015 Hoogenboom ....... H01J 37/228
                                                      250/307
2019/0195621 A1   6/2019 Ogawa et al.

OTHER PUBLICATIONS

Search Report from corresponding Netherlands Application No. 2024694, Nov. 1, 2020.
International Search Report from PCT Application No. PCT/EP2021/050928, Mar. 22, 2021.

* cited by examiner

APPARATUS AND METHOD FOR PROJECTING AN ARRAY OF MULTIPLE CHARGED PARTICLE BEAMLETS ON A SAMPLE

FIELD OF THE INVENTION

The invention relates to an apparatus and method for projecting an array of multiple charged particle beamlets on a sample.

BACKGROUND

Such an apparatus or method is for example disclosed in US 2015/027095 A1. This patent application describes an apparatus for inspecting a surface of a sample. Said apparatus comprises a generator for generating an array of primary charged particle beamlets, and a charged particle optical system with an optical axis. The charged particle optical system comprises a lens system for focusing the primary charged particle beamlets into an array of spots on the sample surface. The lens system comprises at least one electromagnetic lens which is common for all charged particle beams. Preferably the objective lens for focusing the array of primary charged particle beamlets comprises said electromagnetic lens, which is arranged for rotating the array of primary charged particle beamlets around the optical axis of the charged particle optical system.

SUMMARY OF THE INVENTION

When the charged particle optical system comprises a magnetic lens common for al primary charged particle beamlets of said array of primary charged particle beamlets, said array will rotate and/or change magnification when the excitation and/or strength of the magnetic lens is changed.

It is an object of the present invention to provide an apparatus and method which the pitch and/or the rotation of the array of primary charged particle beamlets on the sample is at least substantially kept constant.

According to a first aspect, the invention provides an apparatus for inspecting a sample, wherein the apparatus comprises:
a sample holder for holding the sample at a sample plane,
a charged particle column for generating an array of multiple charged particle beamlets and directing said array of multiple charged particle beamlets towards the sample holder, wherein said charged particle column comprises an objective lens for focusing the charged particle beamlets of said array of multiple charged particle beamlets in an array of charged particle beam spots at or near the sample plane, wherein the objective lens comprises a magnetic lens common for all charged particle beamlets of said array of multiple charged particle beamlets,
a position sensor which is configured to provide a signal which is dependent on the position of the sample in a direction along an optical axis of the charged particle column, and
a control unit which is configured to control the position of the sample holder, at least in a direction parallel to the optical axis of the charged particle column, on the basis of the signal from the position sensor.

Due to the combined position sensor and control unit in the multi-charged particle beam inspection apparatus of the present invention, the sample holder can be controlled to keep the part of the sample that is inspected by means of the array of multiple charged particle beams, positioned at the sample plane and/or the focal plane of the multi-charged particle beam inspection apparatus. When the settings of the charged particle column are not changed, and the part of the sample that is inspected is kept at the sample plane and/or the focal plane of the multi-charged particle beam inspection apparatus, the pitch and rotation of the array of multiple charged particle beamlets on the sample at the sample plane and/or the focal plane of the multi-charged particle beam inspection apparatus can be kept constant. It is noted that for imaging a sample, the sample plane is preferably arranged at the focal plane of the multi-charged particle beam inspection apparatus.

It is noted that in case the sample holder is arranged to position the sample at least partially in the magnetic field of the magnetic objective lens, said array of primary charged particle beamlets will rotate in the magnetic field on its way toward the sample. The rotation is inter alia dependent on the magnetic field strength of the magnetic lens. Even if the sample holder is configured to arrange the sample surface at a field-free area, then a change in the position of the sample in a direction along an optical axis of the charged particle column, usually requires to adjust the focus, and thus the magnetic field strength, to keep the sample in focus. Accordingly, the orientation of the array of primary charged particle beamlets at the surface of the sample is dependent on the position of the sample with respect to the magnetic lens, in particular on the position in a direction along the optical axis of the charged particle optical system.

Due to the combined position sensor and control unit in the multi-charged particle beam inspection apparatus of the present invention, the sample holder can be controlled to keep the part of the sample that is inspected by means of the array of multiple charged particle beams, positioned at the desired distance from the magnetic objective lens. When the settings of the charged particle column are not changed, and the part of the sample that is inspected is kept at the desired distance from the magnetic objective lens, the pitch and rotation of the array of multiple charged particle beamlets on the sample at the sample plane can be kept constant.

Moreover, it is noted that the depth of focus of a charged particle inspection device, such as an electron microscope, is relatively large. Accordingly, within at least a part of the range of the depth of focus, the sample can be moved in the direction parallel to the optical axis of the charged particle optical system in order to arrange the sample at a desired position along the optical axis where the array of multiple charged particle beamlets has a desired orientation in a direction around the optical axis of the charged particle column. The desired orientation of the array of charged particle beam spots at or near the sample plane is, for example, dependent on the direction(s) in which the array of multiple charged particle beamlets can be scanned over the sample and/or on the direction(s) in which the sample can be moved with respect to the charged particle column. Due to the combined position sensor and control unit in the multi-charged particle beam inspection apparatus of the present invention, the sample holder can be controlled to keep the part of the sample that is inspected by means of the array of multiple charged particle beams, at the desired position and to keep the array of charged particle beam spots at or near the sample plane in the desired orientation.

In an embodiment, the position sensor is configured such that the signal is dependent on the position of the sample holder or sample plane with respect to the objective lens. In particular, the signal is dependent on the distance between the sample holder or sample plane and the objective lens. As stated above, the orientation of the array of primary charged particle beamlets at the surface of the sample is dependent on the position of the sample with respect to the magnetic lens, in particular on the position in a direction along the optical axis of the charged particle optical system.

In an embodiment, the apparatus further comprises a light detector for detecting photons created by one or more charged particle beamlets of said array of multiple charged particle beamlets when they impinge on the sample, or when said one or more charged particle beamlets impinge onto a layer of luminescent material after transmission through the sample, and a light optical assembly for projecting or imaging at least part of said photons along an optical beam path onto said light detector.

In an embodiment, the light optical assembly is configured to image the sample plane onto the light detector. This embodiment provides an improvement in a so-called integrated inspection apparatus, featuring the integration of a multi-beam charged particle inspection apparatus, such as a multi-beam scanning electron microscope (multi-beam SEM), and a light optical inspection apparatus, such as a light optical microscope optics. According to the present invention, when the settings of the charged particle column are not changed and the part of the sample that is inspected is kept at the desired distance from the magnetic objective lens, the pitch and rotation of the array of multiple charged particle beamlets on the sample at the sample plane can be kept constant. Furthermore, the present invention allows to provide and maintain a desired alignment and pitch of the charged particle beamlets in the array of multiple charged particle beamlets with respect to the light optical microscope, in particular with respect to the light detector of the light optical microscope.

In an embodiment, the light optical assembly comprises an optical objective lens for collecting photons from said sample and/or said layer of luminescent material.

In an embodiment, the apparatus further comprises an optical focus sensor which is configured to provide a signal which is dependent on the distance between the sample plane and the optical objective lens, and wherein the control unit is configured to control the position of the sample holder, at least in a direction parallel to the optical axis of the charged particle column, on the basis of the signal from the optical focus sensor. In addition to or alternatively to using the position sensor, the optical focus sensor can also be used to control the sample holder to keep the part of the sample that is inspected by means of the array of multiple charged particle beams, positioned at the sample plane. The combination of the optical focus sensor and the control unit allows to keep the sample within the focus of the light optical assembly with the light detector, and thus to keep the part of the sample that is inspected by means of the array of multiple charged particle beams, positioned at the sample plane. When the settings of the charged particle column are not changed, and the part of the sample that is inspected is kept at the sample plane, the pitch and rotation of the array of multiple charged particle beamlets on the sample at the sample plane can be kept constant.

In an embodiment, the light optical assembly, in particular the optical objective lens thereof, comprises a light optical axis, wherein the apparatus is configured such that the light optical axis is substantially parallel to the optical axis of the charged particle column. In this embodiment, a change in the position of the sample in a direction along the optical axis of the charged particle column results in a same change in the position of the sample in a direction along the light optical axis. Accordingly, when the light optical assembly is used to keep the sample in a substantially constant position along the light optical axis, this will also keep the sample in a substantially constant position along the optical axis of the charged particle column.

It is noted that the depth of focus of the light optical assembly at the sample is usually much less than the depth of focus of a charged particle inspection device. Accordingly, by positioning and/or keeping the sample in the focus of the light optical assembly, the part of the sample that is inspected by means of the array of multiple charged particle beams is also positioned and/or kept at a substantially fixed distance from the magnetic objective lens. When the settings of the charged particle column are not changed, and the part of the sample that is inspected is kept at the desired distance from the magnetic objective lens, the pitch and rotation of the array of multiple charged particle beamlets on the sample at the sample plane can be kept constant.

According to a second aspect, the invention provides an apparatus for inspecting a sample, wherein the apparatus comprises:
- a sample holder for holding the sample at a sample plane,
- a charged particle column for generating an array of multiple charged particle beamlets and directing said array of multiple charged particle beamlets towards the sample holder, wherein said charged particle column comprises an objective lens for focusing the charged particle beamlets of said array of multiple charged particle beamlets in an array of charged particle beam spots at or near the sample plane, wherein the objective lens comprises a magnetic lens common for all charged particle beamlets of said array of multiple charged particle beamlets,
- a light detector for detecting photons created by one or more of said charged particle beamlets of said array of multiple charged particle beamlets when they impinge on the sample, or when said one or more charged particle beamlets impinge onto a layer of luminescent material after transmission through the sample,
- a light optical assembly for projecting or imaging at least part of said photons along an optical beam path onto said light detector, wherein the light optical assembly comprises an optical objective lens for collecting photons from said sample and/or said layer of luminescent material,
- an optical focus sensor which is configured to provide a signal which is dependent on the distance between the sample holder or sample plane and the optical objective lens, and
- a control unit which is configured to control the position of the sample holder, at least in a direction parallel to the optical axis of the charged particle column, on the basis of the signal from the optical focus sensor.

In a combined multi-beam charged particle device and optical inspection device, the optical inspection device can be used The combination of the optical focus sensor and the control unit allows to keep the sample within the focus of the light optical assembly with the light detector and/or to keep the part of the sample that is inspected by means of the array of multiple charged particle beams, positioned at the sample plane. When the settings of the charged particle column are not changed, and the part of the sample that is inspected is kept at the sample plane, the pitch and rotation of the array of multiple charged particle beamlets on the sample at the sample plane can be kept constant.

In an embodiment, the optical objective lens comprises a light optical axis, wherein the apparatus is configured such that the light optical axis is substantially parallel to the optical axis of the charged particle column.

In an embodiment, the light optical assembly is configured to image the sample plane onto the light detector. This embodiment provides an improvement in a so-called integrated inspection apparatus, featuring the integration of a multi-beam charged particle inspection apparatus, such as a multi-beam scanning electron microscope (SEM), and a light optical inspection apparatus, such as a light optical microscope optics, where the light optical microscope is used to set and keep the alignment of the array of charged particles on the sample at least substantially constant during an inspection of said sample.

According to a third aspect, the invention provides a method for inspecting a sample, wherein the method comprises the steps of:
arranging the sample in a sample holder,
generating and directing an array of multiple charged particle beamlets towards the sample using a charged particle column, wherein said charged particle column comprises an objective lens which focuses the charged particle beamlets of said array of multiple charged particle beamlets in an array of charged particle beam spots at or near the sample plane, wherein the objective lens comprises a magnetic lens common for all charged particle beamlets of said array of multiple charged particle beamlets,
using a position sensor to provide a signal which is dependent on the position of the sample in a direction along an optical axis of the charged particle column, and
using a control unit to control the position of the sample holder, at least in a direction parallel to the optical axis of the charged particle column, on the basis of the signal from the position sensor.

In an embodiment, the position sensor is configured such that the signal is dependent on the distance between the sample holder or sample plane and the objective lens In an embodiment, the method comprises the steps of:
adjusting the position of the sample holder and/or the charged particle column with respect to each other at least in a direction parallel to the optical axis of the charged particle column, and/or focusing and setting a desired pitch and orientation of the array of multiple charged particle beamlets at the sample plane.

According to a fourth aspect, the invention provides a method for inspecting a sample, wherein the method comprises the steps of:
arranging the sample in a sample holder,
generating and directing an array of multiple charged particle beamlets towards the sample using a charged particle column, wherein said charged particle column comprises an objective lens which focuses the charged particle beamlets of said array of multiple charged particle beamlets in an array of charged particle beam spots at or near the sample plane, wherein the objective lens comprises a magnetic lens common for all charged particle beamlets of said array of multiple charged particle beamlets,
using a light detector for detecting photons created by one or more of said charged particle beamlets of said array of multiple charged particle beamlets when they impinge on the sample, or when said one or more charged particle beamlets impinge onto a layer of luminescent material after transmission through the sample,
using a light optical assembly to project or image at least part of said photons along an optical beam path onto said light detector, wherein the light optical assembly comprises an optical objective lens for collecting photons from said sample and/or said layer of luminescent material,
using an optical focus sensor to provide a signal which is dependent on the distance between the sample holder or sample plane and the optical objective lens, and
using a control unit to control the position of the sample holder, at least in a direction parallel to the optical axis of the charged particle column, on the basis of the signal from the optical focus sensor.

According to a fifth aspect, the invention provides a computer-readable medium having computer-executable instructions adapted to cause an apparatus according as described above or an embodiment thereof, to perform a method as described above or an embodiment thereof.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
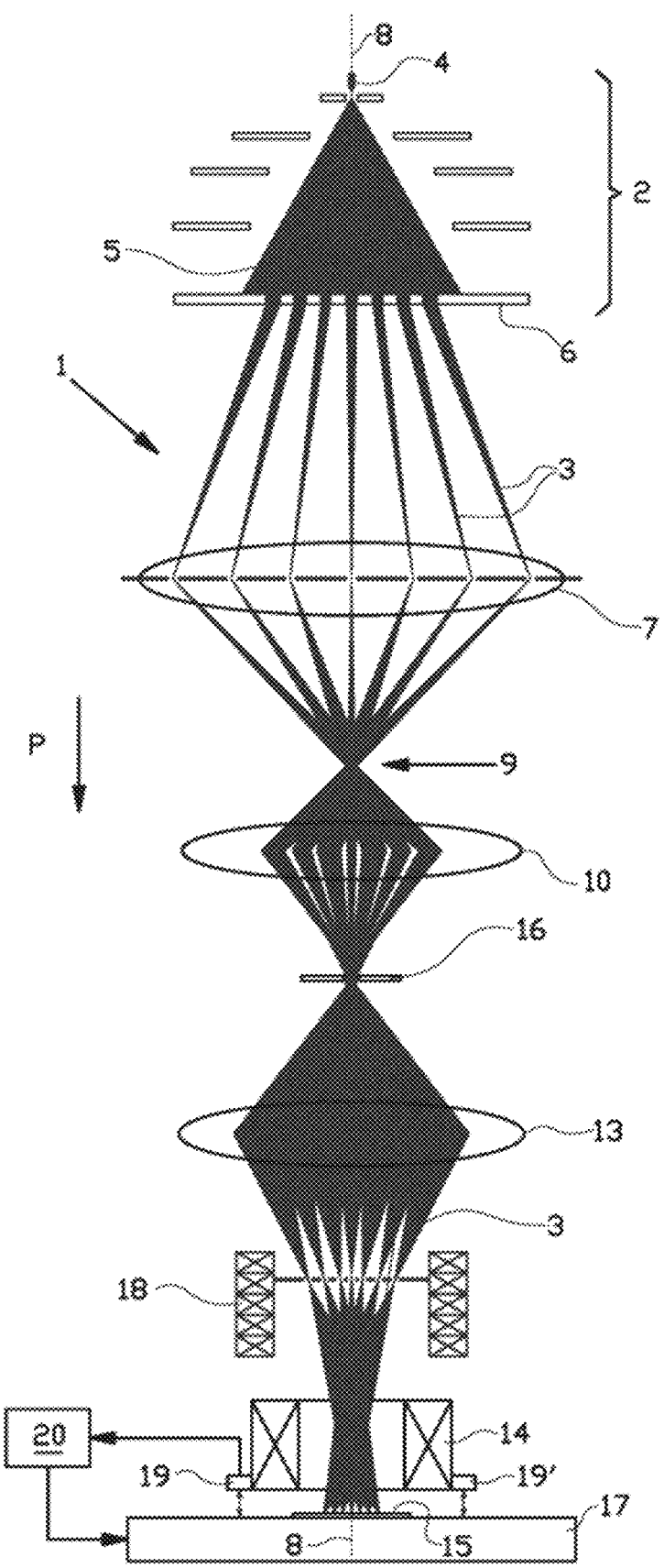
FIG. 1 schematically shows a first exemplary embodiment of an apparatus as typically improved by the present invention.

FIG. 1 schematically shows a first exemplary embodiment of an apparatus as typically improved by the present invention. The apparatus according to this first example comprises a Multi-Beam Scanning Electron Microscope (MBSEM). The MBSEM 1 comprises a multi beam charged particle generator 2 for generating an array of primary charged particle beamlets, in this case an array of primary electron beamlets 3. The multi beam electron generator 2 comprises at least one electron source 4 for generating a diverging electron beam 5. The diverging electron beam 5 is split into an array of focused primary electron beamlets 3 by an aperture lens array 6. The primary electron beamlets 3 are subsequently directed towards a sample 15 in a sample holder 17, as schematically indicated by the arrow P.

The multiple images of the source 4 are positioned on the object principle plane of an accelerator lens 7. The accelerator lens 7 directs the primary electron beamlets 3 towards the optical axis 8 and creates a first common cross-over 9 of all the primary electron beamlets 3. The first common cross-over 9 is imaged by the magnetic condenser lens 10 onto a variable aperture 16 that acts as a current limiting aperture. At the variable aperture 16, a second common cross-over of all the primary electron beamlets 3 is created.

The MBSEM comprises a lens system 13, 14 for directing the primary charged particle beamlets from the common cross-over at the variable aperture 16 towards the sample surface 15 and for focusing all primary charged particle beamlets 3 into an array of individual spots on the sample surface 15. The lens system comprises an intermediate magnetic lens 13 for imaging the variable aperture 16 onto a coma free plane of the objective lens 14, which objective lens 14 creates an array of focused primary electron beamlets on the sample surface 15.

In addition, the MBSEM is provided with scan coils 18 for scanning the array of focused primary electron beamlets over the sample surface 15.

The MBSEM thus comprises a charged particle column for generating an array of multiple charged particle beamlets 3 and directing said array of multiple charged particle beamlets 3 towards the sample holder 17, wherein said charged particle column comprises an objective lens 14 for focusing the charged particle beamlets of said array of multiple charged particle beamlets in an array of charged particle beam spots at or near the sample surface 15, wherein the objective lens 14 comprises a magnetic lens common for all charged particle beamlets of said array of multiple charged particle beamlets 3.

The apparatus of FIG. 1 further comprises a position sensor 19 which is configured to provide a signal which is dependent on the position of the sample 15 in a direction along an optical axis 8 of the charged particle column, and a control unit 20 which is connected to the position sensor 19 for receiving the signal, and which is connected to the sample holder 17 to control actuators in the sample holder 17 for moving the sample 15. The control unit 20 is configured to control the position of the sample holder 17, at least in a direction parallel to the optical axis 8 of the charged particle column, on the basis of the signal from the position sensor 19. The position sensor 19, the control unit 20 and the sample holder 17 are configured to provide a control loop to position the sample 15 in the direction parallel to the optical axis 8. In this way the sample 15 can be arranged at a desired position along the optical axis 8, at which position the array of charged particle beamlets 3 have a desired orientation or alignment, and the control loop can be used to keep the sample 15 at said desired position. During the inspection of said sample 15, the settings of the MBSEM preferably remain unchanged and thus the pitch and orientation of the array of multiple charged particle beamlets 3 is kept constant.

It is noted, that it is preferred that the position sensor 19 measures the position of a sample 15 on the sample holder 17 in line with the optical axis 8. Since the position sensor 19 is arranged spaced apart from the optical axis 8 in a direction perpendicular to the optical axis 8, the distance between the sensor 19 and the sample holder 17 is sensitive to tilt errors. Such a tilt error can substantially be prevented by using two position sensors 19, 19' as schematically shown in FIG. 1.

In addition or alternatively, the two position sensors 19, 19' can be configured to use triangulation for determining the position of the sample 15 along the optical axis 8.

It is further noted, that a MBSEM as presented in FIG. 1, is commonly arranged in a vacuum chamber. In addition, the MBSEM is commonly provided with sensors for detecting secondary charged particles and/or electromagnetic radiation which originates from the sample 15 when the primary charged particle beamlets 3 impinge on the sample 15.

Figure 2:
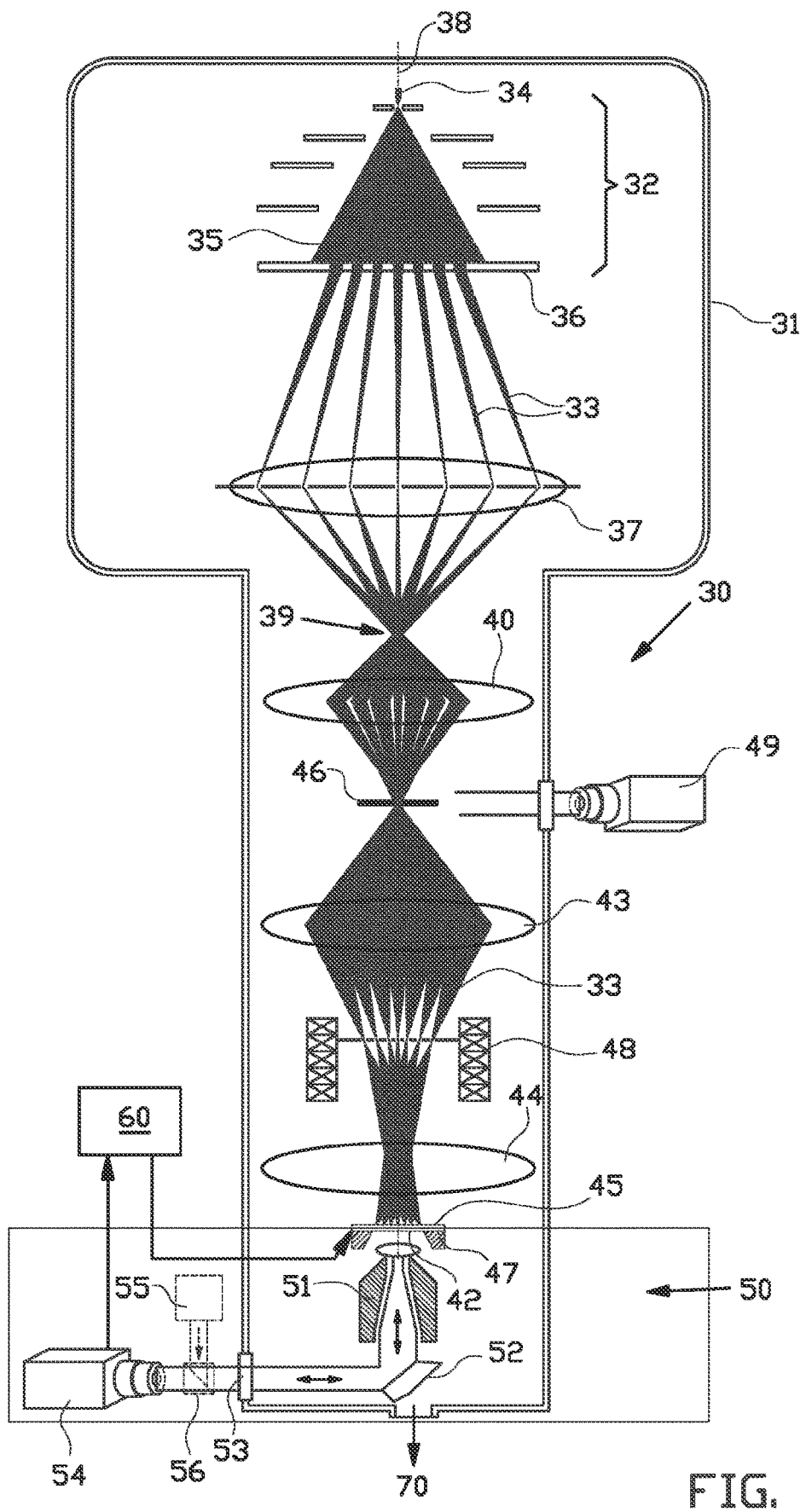
FIG. 2 schematically shows a second exemplary embodiment of an apparatus as typically improved by the present invention.

FIG. 2 schematically shows a second exemplary embodiment of an apparatus as typically improved by the present invention. The apparatus according to this second example features the integration of a multi-beam charged particle inspection apparatus, such as a multi-beam scanning electron microscope 30 (MBSEM), and a light optical inspection apparatus, such as a light optical microscope 50. The multi-beam scanning electron microscope 30 (MBSEM), and a light optical inspection apparatus, such as a light optical microscope 50, are mechanically coupled The MBSEM 30 can be essentially the same apparatus as presented in the first example above. Accordingly, the MBSEM 30 comprises a multi beam charged particle generator 32 for generating an array of primary charged particle beamlets, in this case an array of primary electron beamlets 33. The multi beam electron generator 32 comprises at least one electron source 34 for generating a diverging electron beam 35. The diverging electron beam 35 is split into an array of focused primary electron beamlets 33 by an aperture lens array 36. The primary electron beamlets 33 are subsequently directed towards a sample 45 in a sample holder 47. The multiple images of the source 34 are positioned on the object principle plane of an accelerator lens 37. The accelerator lens 37 directs the primary electron beamlets 33 towards the optical axis 38 and creates a first common cross-over 39 of all the primary electron beamlets 33. The first common cross-over 39 is imaged by the magnetic condenser lens 40 onto a variable aperture 46 that acts as a current limiting aperture. At the variable aperture 46, a second common cross-over of all the primary electron beamlets 33 is created. The MBSEM comprises a lens system 43, 44 for directing the primary charged particle beamlets from the common cross-over at the variable aperture 46 towards the sample surface 45 and for focusing all primary charged particle beamlets 33 into an array of individual spots on the sample surface 45. The lens system comprises an intermediate magnetic lens 43 for imaging the variable aperture 46 onto a coma free plane of the objective lens 44, which objective lens 44 creates an array of focused primary electron beamlets on the sample surface 45. In addition, the MBSEM is provided with scan coils 48 for scanning the array of focused primary electron beamlets 33 over the surface of the sample 45.

Preferably, the MBSEM is also provided with a charged particle sensor 49, which is configured to detect secondary charged particles and/or electromagnetic radiation which originate from the sample when the primary charged particle beamlets 33 impinge on the sample 45. For clarity reasons trajectories of the secondary charged particles are not shown in the figures and also the charged particle sensor 49 is presented very schematically.

As indicated in FIG. 2, the MBSEM is arranged inside a vacuum chamber 31, which comprises an output port 70 for connecting the vacuum chamber 31 with a vacuum pump (not shown).

Below the sample holder 47, a light optical microscope 50 is arranged. The light optical microscope 50 comprises a microscope objective 51, which is arranged inside the vacuum chamber 31. The other major parts of the light optical microscope system are arranged outside the vacuum chamber 31. Light from the sample 45 is collected by the microscope objective 51 and is imaged via the mirror 52, the window 53 and the half transparent mirror or dichroic 56 onto a light detector 54, for example a CCD sensor.

It is noted that it is also possible to use a light optical microscope 50 which comprises a light source 55, for example a LED. The emitted light from the light source 55 is directed towards a half transparent mirror or dichroic 56 and is directed into the vacuum chamber 31 via a window 53. This light is coupled into the microscope objective 51 via a mirror 52, for illuminating the sample 45 from the bottom side.

In use, the light detector 54 is configured for detecting reflected light from the sample 45. In addition, the light detector 54 is configured for detecting photons created by one or more of said charged particle beamlets of said array of multiple charged particle beamlets 33 when they impinge on the sample 45, or when said one or more charged particle beamlets impinge onto a layer of luminescent material 42 after transmission through the sample 45.

The light detector 54 can be used as an optical focus sensor, for example by providing a signal which is dependent on whether or not the sample 45 is in the focus of the light detector 54. In addition or alternatively, the light optical microscope can be provided with a separate optical focus sensor which is configured to provide a signal which is dependent on the distance between the sample holder 47 or sample surface 45 and the optical objective lens 51, for example using well known techniques for providing an autofocus, such as triangulation, phase detection or contrast detection.

The signal from the light detector 54 or separate optical focus sensor is provided to a control unit 60 which is configured to control the position of the sample holder 47, at least in a direction parallel to the optical axis 38 of the MBSEM 30, on the basis of the signal from the light detector 54 or separate optical focus sensor.

It is noted, that the optical focus sensor preferably uses a wavelength which at least substantially differs from the wavelength of emission light from the sample. In this way, the optical focus sensor does not interfere with the collection of emission light from the sample.

As presented above, the final MBSEM lens 44 comprises a magnetic lens common for all charged particle beamlets of said array of multiple charged particle beamlets 33. The pattern of the array of multiple charged particle beamlets 33 as projected on the sample 45 by the magnetic lens 44 is non-telecentric in general. Even if the sample holder 47 is configured to arrange the sample 45 at a field-free area, then a change in the position of the sample 45 in a direction along the optical axis 38, usually requires to adjust the focus, and thus the magnetic field strength, of the magnetic lens 44 to keep the sample 45 in focus. Hence, if the excitation/strength of the magnetic lens 44 is changed (for example for focusing) the pattern of the array of multiple charged particle beamlets 33 will rotate and/or change magnification. To solve this problem, the present invention provides a method comprising the following steps:

The position of the sample 45 along the optical axis of the MBSEM 30 is adjusted so that the sample 45 is in focus of the light detector 54, The array of multiple charged particle beamlets 33 is focused on the sample 45 and is set to a desired pitch (magnification). The sample 45, the light optical focus and the MBSEM focus are now in the same plane.

The light detector 54 and/or a separate optical focus sensor is provided which are/is configured to provide a signal which is a measure between the light optical focus and the sample surface 45.

This signal is used in a control unit to control the sample holder 47 to keep the sample surface 45 within the focus of the light detector 54.

In this way, the sample 45 is kept within the focus of the light detector 54, and thus also within the focus of the MBSEM. During an inspection of the sample 45, the settings of the MBSEM remain substantially unchanged and thus the pitch and orientation (in particular the rotation around the optical axis 8) of the array of charged particle beam spots on the sample surface 45 is kept substantially constant.

It is noted that steps a and b above can be iterative to obtain the desired alignment.

It is to be understood that the above description is included to illustrate the operation of the preferred embodiments and is not meant to limit the scope of the invention.

From the above discussion, many variations will be apparent to one skilled in the art that would yet be encompassed by the scope of the present invention.

In summary, the invention provides an apparatus for inspecting a sample, comprising a sample holder for holding the sample at a sample plane, and a charged particle column for generating an array of multiple charged particle beamlets and directing said array towards the sample holder. Said charged particle column comprises an objective lens for focusing the charged particle beamlets of said array in an array of charged particle beam spots at or near the sample plane. The objective lens comprises a magnetic lens common for all charged particle beamlets. The apparatus further comprises a position sensor for providing a signal which is dependent on the position of the sample along an optical axis of the charged particle column, and a control unit for controlling the position of the sample holder on the basis of the signal from the position sensor, in order to keep the pitch and/or orientation of the spots on the sample constant.

The invention claimed is:

1. An apparatus for inspecting a sample, the apparatus comprising:
   a sample holder for holding the sample at a sample plane;
   a charged particle column for generating an array of multiple charged particle beamlets and directing said array of multiple charged particle beamlets towards the sample holder,
       wherein said charged particle column comprises an objective lens for focusing the charged particle beamlets of said array of multiple charged particle beamlets in an array of charged particle beam spots at or near the sample plane,
       wherein the objective lens comprises a magnetic lens common for all charged particle beamlets of said array of multiple charged particle beamlets;
   a light detector for detecting photons created by one or more charged particle beamlets of said array of multiple charged particle beamlets when they impinge on the sample, or when said one or more charged particle beamlets impinge onto a layer of luminescent material after transmission through the sample,
   a light optical assembly for projecting or imaging at least part of said photons along an optical beam path onto said light detector, wherein the light optical assembly comprises an optical objective lens for collecting photons from said sample and/or said layer of luminescent material,
   wherein the apparatus further comprises an optical focus sensor which is configured to provide a signal which is dependent on the distance between the sample plane and the optical objective lens, and
   a control unit which is configured to control the position of the sample holder, at least in a direction parallel to the optical axis of the charged particle column, on the basis of the signal from the optical focus sensor to keep a part of the sample that is inspected by means of the array of multiple charged particle beamlets positioned at a desired distance from the magnetic lens to keep the array of multiple charged particle beam spots at or near the sample plane in a desired orientation.

2. The apparatus according to claim 1, wherein the light optical assembly is configured to image the sample plane onto the light detector.

3. The apparatus according to claim 1, wherein the optical objective lens comprises a light optical axis, wherein the apparatus is configured such that the light optical axis is substantially parallel to the optical axis of the charged particle column.

4. The apparatus according to claim 1, wherein the apparatus is configured to provide a fixed distance between the magnetic lens and the focus of the light optical assembly.

5. The apparatus according to claim 4, wherein the light optical assembly is configured to image the sample plane onto the light detector.

6. The apparatus according to claim 1, wherein the apparatus further comprises a position sensor which is configured to provide a signal which is dependent on the position of the sample in a direction along an optical axis of the charged particle column, and
wherein the control unit is configured to control the position of the sample holder, at least in a direction parallel to the optical axis of the charged particle column, on the basis of the signal from the position sensor.

7. The apparatus according to claim 6, wherein the position sensor is configured such that the signal is dependent on the position of the sample holder or sample plane with respect to the objective lens.

8. A method for inspecting a sample, the method comprising the steps of:
arranging the sample in a sample holder;
generating and directing an array of multiple charged particle beamlets towards the sample using a charged particle column,
wherein said charged particle column comprises an objective lens which focuses the charged particle beamlets of said array of multiple charged particle beamlets in an array of charged particle beam spots at or near the sample plane,
wherein the objective lens comprises a magnetic lens common for all charged particle beamlets of said array of multiple charged particle beamlets;
detecting photons created by one or more charged particle beamlets of said array of multiple charged particle beamlets when they impinge on the sample, or when said one or more charged particle beamlets impinge onto a layer of luminescent material after transmission through the sample, using a light detector, and
a light optical assembly for projecting or imaging at least part of said photons along an optical beam path onto said light detector, wherein the light optical assembly comprises an optical objective lens for collecting photons from said sample and/or said layer of luminescent material;
using an optical focus sensor to provide a signal which is dependent on the distance between the sample plane and the optical objective lens; and
using a control unit to control the position of the sample holder, at least in a direction parallel to the optical axis of the charged particle column, on the basis of the signal from the position sensor to keep a part of the sample that is inspected by means of the array of multiple charged particle beamlets positioned at the desired distance from the magnetic lens to keep the array of multiple charged particle beam spots at or near the sample plane in a desired orientation.

9. A computer-readable medium having computer-executable instructions stored thereon adapted to cause an apparatus to perform a method according to claim 8.

10. The method according to claim 8, wherein the focus of the light optical assembly is arranged at a fixed distance to the magnetic lens.

11. The method according to claim 8, further comprising the steps of:
using a position sensor to provide a signal which is dependent on the position of the sample in a direction along an optical axis of the charged particle column, wherein the position sensor is configured such that the signal is dependent on the distance between the sample holder or sample plane and the objective lens; and
using a control unit to control the position of the sample holder, at least in a direction parallel to the optical axis of the charged particle column, on the basis of the signal from the position sensor to keep a part of the sample that is inspected by means of the array of multiple charged particle beamlets positioned at the desired distance from the magnetic lens to keep the array of multiple charged particle beam spots at or near the sample plane in a desired orientation.

* * * * *